(12) United States Patent
Greeff et al.

(10) Patent No.: US 7,514,979 B2
(45) Date of Patent: Apr. 7, 2009

(54) DE-EMPHASIS SYSTEM AND METHOD FOR COUPLING DIGITAL SIGNALS THROUGH CAPACITIVELY LOADED LINES

(75) Inventors: Roy Greeff, Boise, ID (US); David Ovard, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/113,066

(22) Filed: Apr. 30, 2008

(65) Prior Publication Data

US 2008/0204108 A1    Aug. 28, 2008

Related U.S. Application Data

(62) Division of application No. 11/442,510, filed on May 25, 2006, now Pat. No. 7,375,573.

(51) Int. Cl.
*H03L 5/00* (2006.01)
(52) U.S. Cl. ...................... 327/308; 327/321
(58) Field of Classification Search ............... 327/308, 327/309, 317, 321
See application file for complete search history.

(56) References Cited

U.S. PATENT DOCUMENTS

| | | | |
|---|---|---|---|
| 4,570,193 A | 2/1986 | Yamashita | 386/93 |
| 4,587,576 A | 5/1986 | Hirota et al. | 386/93 |
| 4,700,345 A | 10/1987 | Morcom et al. | 370/477 |
| 4,811,100 A | 3/1989 | Umezawa | 348/625 |
| 4,882,628 A | 11/1989 | Sugimori et al. | 348/628 |
| 4,928,287 A | 5/1990 | Tanaka | 375/231 |
| 5,144,434 A | 9/1992 | Yamashita et al. | 348/613 |
| 5,260,775 A | 11/1993 | Farouda | 348/619 |
| 5,267,022 A | 11/1993 | Sakamoto et al. | 348/488 |
| 5,268,759 A | 12/1993 | Kishimoto et al. | 348/606 |
| 5,319,451 A | 6/1994 | Sasaki et al. | 348/282 |
| 5,696,852 A | 12/1997 | Minoura et al. | 382/266 |
| 7,375,573 B2 * | 5/2008 | Greeff et al. | 327/308 |

* cited by examiner

*Primary Examiner*—Kenneth B. Wells
(74) *Attorney, Agent, or Firm*—Dorsey & Whitney LLP

(57) ABSTRACT

A system for de-emphasizing digital signals, such as address signals, boosts the level of the signals for one clock period prior to transmitting the signals through signal lines that may have a relatively large capacitance. The system may include a delay circuit that delays the digital signal for a period corresponding to one period of a clock signal. The system may also include a first multiplier circuit that generates a first intermediate signal by multiplying the first and second logic levels of the digital signal by a first multiplier. Similarly, a second multiplier circuit generates a second intermediate signal by multiplying the first and second logic levels of the delayed signal from the delay circuit by a second multiplier. A combining circuit then subtracts the second intermediate signal from the first intermediate signal, and the resulting signal is level-adjusted to generate the de-emphasized signal.

23 Claims, 5 Drawing Sheets

DE-EMPHASIS SYSTEM AND METHOD FOR COUPLING DIGITAL SIGNALS THROUGH CAPACITIVELY LOADED LINES

CROSS-REFERENCE TO RELATED APPLICATION

This application is a divisional of U.S. patent application Ser. No. 11/442,510, filed May 25, 2006.

TECHNICAL FIELD

This invention relates to digital integrated circuits, and, more particularly, to a system and method for adjusting the waveform of a digital signal before it is coupled though a highly capacitive line to make it easier to correctly detect the signal at a receiving device.

BACKGROUND OF THE INVENTION

As the operating speeds of electronic devices, such as memory devices, continues to increase, the timing of digital signals received by the devices has become ever more critical. For example, in a memory device, such as a dynamic random access memory ("DRAM") device, command, address and write data signals are transmitted to the memory device by a memory controller, and read data signals are transmitted to the memory controller by the memory device. Conventional memory devices generally operate synchronously with a clock signal, which defines the times that the received signals are considered valid. As the operating speed of memory devices continues to increase, the period during which the command, address and write data signals received by the memory device are considered valid has become ever shorter. As a result, it has become more critical to control the timing at which these signal are received by memory devices.

The timing of digital signals, such as command, address and data signals, are adversely affected by "jitter," which is high frequency phase noise that cause rapid changes in the timing at which transitions of the digital signal occur. Jitter can be caused by a number of sources, such as noise coupled to digital circuits along with a digital signal, which causes the switching time of the digital circuit to vary in a random manner. Jitter can also be caused by variations in the shape of digital signals coupled to digital circuits.

With reference to FIG. 1, a digital signal having the waveform shown by the dotted line may be applied into a signal line. When the digital signal is applied to the signal line, its signal levels vary between voltages 0 and V*. As shown in FIG. 1, the transmitted waveform has a 50% duty cycle between time $t_0$ and time $t_2$. A "double width" pulse then occurs starting at time $t_2$ followed by a return to the original waveform starting at time $t_4$. If the signal line is highly capacitive, the waveform received by a downstream electronic device may have the waveform shown by the solid line in FIG. 1. As a result of the combination of the high frequency of the signal and the high capacitance of the signal line, the received waveform never reaches the full amplitudes of the transmitted waveform. For example, the transmitted signal starts charging the capacitive signal line toward the voltage V* at time $t_0$, which is shown by the dotted arrow at time $t_0$. However, the amplitude of the received signal never reaches the level V* volts. Instead, it reaches the level $V_1$ at time $t_1$, at which time the transmitted signal starts discharging the signal line toward 0 volts, as again shown by the dotted arrow. Again, the amplitude of the received signal never reaches 0 volts. Instead, it reaches the level $V_2$ at time $t_2$, at which time the transmitted signal again starts charging the signal line. Thus, the capacitive signal line charges toward V* volts from $V_2$ volts, and it starts discharging toward 0 volts from $V_1$ volts.

The symmetrical, unvarying shape of the transmitted signal between times $t_0$-$t_2$, causes the received signal to cross the midpoint voltage M with the same delay after each corresponding edge of the transmitted signal. This can be seen by the uniform spacing between the dotted arrows and the immediately following solid arrows. As a result, a digital circuit that switches state at the midpoint voltage M will change state with a uniform delay after each transition of the signal applied to the signal line.

During the double width pulse starting at time $t_2$, the signal line is charged toward the voltage V* for a longer period of time. The received signal therefore reaches the amplitude $V_3$ volts at time $t_4$ at which time the signal line begins being discharged toward 0 volts. The received signal still crosses the midpoint voltage M with the same delay after the corresponding edge of the transmitted signal as shown by the solid arrow following the dotted arrow at time $t_2$. However, because the discharge of the signal line starts from $V_3$ volts rather than the lower amplitude of $V_1$ volts, it now crosses the midpoint voltage M with a much longer delay after the corresponding edge of the transmitted signal. The skew of the received signal can be seen by the increased spacing of the solid arrow immediately following the dotted arrow at time $t_4$. This skew in the midpoint amplitude M crossing delay as function of the bit pattern of the transmitted signal can results in signal jitter at a circuit receiving the signal. As explained above, jitter can adversely affect the receiving circuit's ability to capture the correct pattern of the transmitted digital signal because the receiving circuit may register the incorrect bit from the received signal.

This jitter problem is particularly acute in coupling address signal to memory devices. Address signal are typically transmitted to a plurality of memory devices through a signal distribution tree. The relatively large size of the tree when a large number of memory devices are present makes the address lines highly capacitive. In fact, the jitter caused by the high capacitance of address signal trees can defeat the major reason for using a tree, i.e., to ensure that address signal transitions arrive at all of the memory devices at the same time. The memory devices in a system attempt to capture the address signals using a clock signal, which may also be coupled through a clock tree. Ideally, a transition of the clock signal used to capture the address signals occurs at the center of the address signal. However, jitter can cause timing skews that cause the clock signal transition to occur before or after a "window" or "eye" during which the address signals are valid. For example, as shown in FIG. 2, if a clock signal CLK does not cause each of several address signals A<0:9> to latch at the proper time, errors in the operation of the memory device may result. Thus, the timing skew of the clock signal CLK relative to the timing skews of the address signals A<0:9> must be limited to allow the CLK signal to latch each of the several address signals A<0:9>. As the data transfer rate increases, the duration of each eye E for which each address signal A<0>-A<9> is valid decreases by a corresponding amount, as will be understood by one skilled in the art. With further reference to FIG. 2, the solid lines indicate the ideal address signals A<0>, A<1>, and A<9> signals, and the dashed lines indicate the worst case potential time skew for each of these signals. The ideal address signals A<0>, A<1>, and A<9> are centered at the rising edge of the CLK signals. The eyes E during which the address signals A<0>, A<1>, and A<9> are valid are defined by time intervals $t_0$-$t_3$, $t_1$-$t_4$, and $t_5$-$t_7$, respectively. In fact, the eyes E of the applied address signals A<0>-A<9> may even vary to such an extent that not all of the address signals are simultaneously valid at any time. In other words, there is no time during which the eyes E of all of the address signals overlap. Under these circumstances, the ideal address signals A<0>, A<1>, and A<9> signals, all of the address signals A<0>-A<9> cannot possibly be captured by the CLK signal. For example, in FIG. 2, the eye E of the A<0> signal from times $t_0$-$t_3$ does not overlap the eye of the A<9> signal from times $t_5$-$t_7$. It is therefore important to limit the jitter or timing skew of the CLK and address signals A<0>-A<9>.

Attempts have been made to solve the jitter problem exemplified by FIGS. 1 and 2 using various equalization techniques. Two different equalization approaches have been tried. The first approach attempts to modify the characteristics of the signal line by either making it less capacitive or by making a transmitted signal less affected by the capacitance, such as by inserting repeaters or inverters in the line. Unfortunately, this approach can unduly increase the cost of digital devices. The second approach attempts to modify the shape of the transmitted signal so that the capacitance of the signal line causes it to be received with close to its original shape. In one example, every transition of the digital signal is provided with a large overshoot, which is capacitively filtered out by the signal line. The size and complexity of circuitry using this approach can again unduly increase the cost of digital devices, particularly since the nature of the modification must depend on the characteristics of the bit pattern.

There is therefore a need for a relatively inexpensive system and method for allowing digital signals having an irregular bit pattern to be coupled through highly capacitive signal lines without causing jitter in the received signal.

DETAILED DESCRIPTION

Figures 3A, 3B:
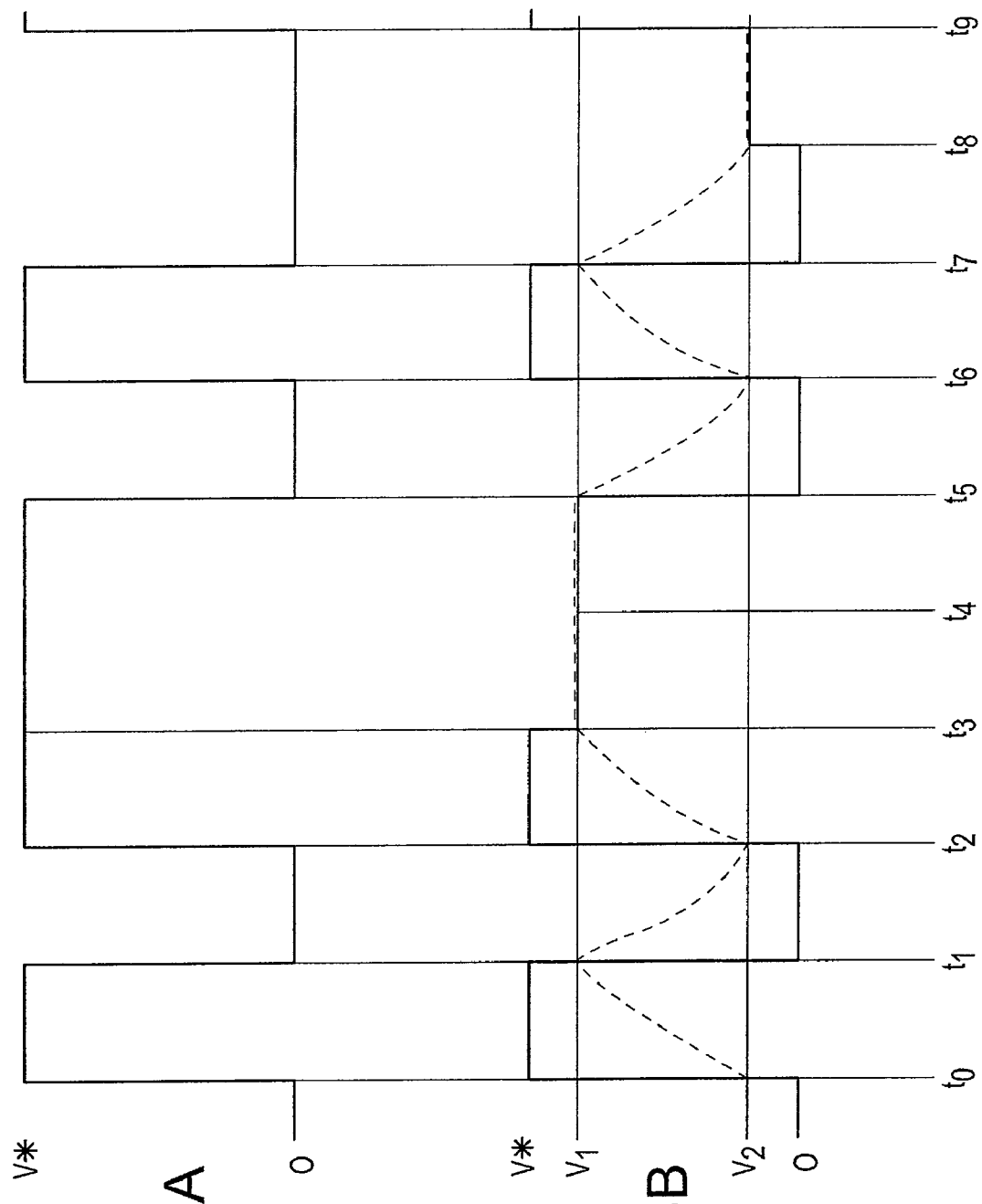
FIGS. 3A and 3B are timing diagrams illustrating the manner in which signal jitter is avoided by a signal de-emphasis system and method according to one example of the invention.

The manner in which a signal de-emphasis system and method according to one example of the invention avoids creating signal jitter is shown in FIGS. 3A and 3B. A digital signal that is to be transmitted through a highly capacitive signal line is shown in FIG. 3A. The signal is assumed to be referenced to a clock signal (not shown) that may be transmitted along with the signal. The signal is high for one clock period between times $t_0$ and $t_1$, is then low for one clock period between times $t_1$ and $t_2$, is high for three clock periods between times $t_2$ and $t_5$, low for one clock period between times $t_5$ and $t_6$, then high for one clock period between times $t_6$ and $t_7$, and finally low for two clock periods between times $t_7$ and $t_9$.

The de-emphasis system and method applies the digital signal to the signal line with the shape shown by the solid line in FIG. 3. As shown therein, when the digital signal is high, it is applied to the signal line with a level of V* volts for the first period of the clock signal, and it then transitions to $V_1$ volts for any remaining period of the clock signal. Similarly, when the digital signal is low, it is applied to the signal line with a level of 0 volts for the first period of the clock signal, and it then transitions to $V_2$ volts for any remaining period of the clock signal. Thus, when the digital signal is high for three clock periods between times $t_2$ and $t_5$, it is applied to the signal line as V* volts for the first clock period between times $t_2$ and $t_3$ followed by $V_1$ volts for the remaining two clock periods between times $t_3$ and $t_5$. When the digital signal is low for two clock periods between times $t_7$ and $t_9$, it is applied to the signal line as 0 volts for the first clock period between times $t_7$ and $t_8$ followed by $V_2$ volts for the remaining clock period between times $t_8$ and $t_9$.

The digital signal as it is received from the highly capacitive signal line at a downstream location is shown by the dotted line in FIG. 3B. The signal line charges toward V* volts between times $t_0$ and $t_1$, and reaches approximately $V_1$ volts after one clock period at time $t_1$. The digital signal is low during the next clock period between times $t_1$ and $t_2$, so the signal line begins discharging from $V_1$ volts toward 0 volts, and it reaches approximately $V_2$ volts after one clock period at time $t_2$. The signal line then begins charging from $V_2$ volts toward V* volts at time $t_2$. Therefore, the charging of the signal line always starts from $V_2$ volts, and the discharging of the signal line always starts from $V_1$ volts.

Figure 1:
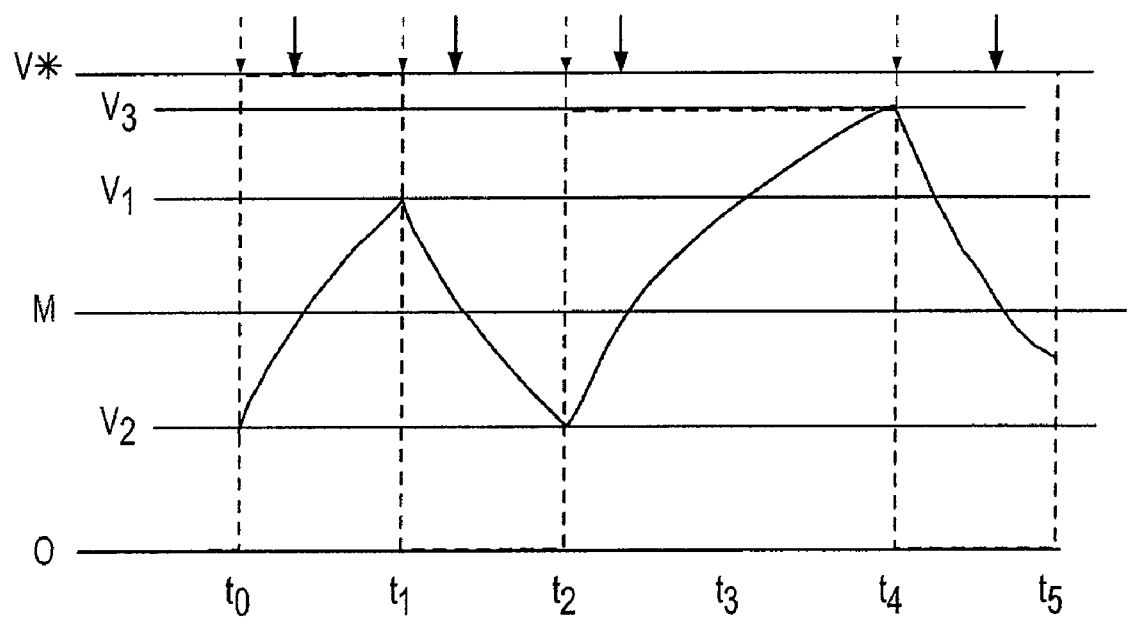
FIG. 1 is a timing diagram illustrating the manner in which signal jitter is created by coupling a digital signal through a highly capacitive signal line.
Figure 2:
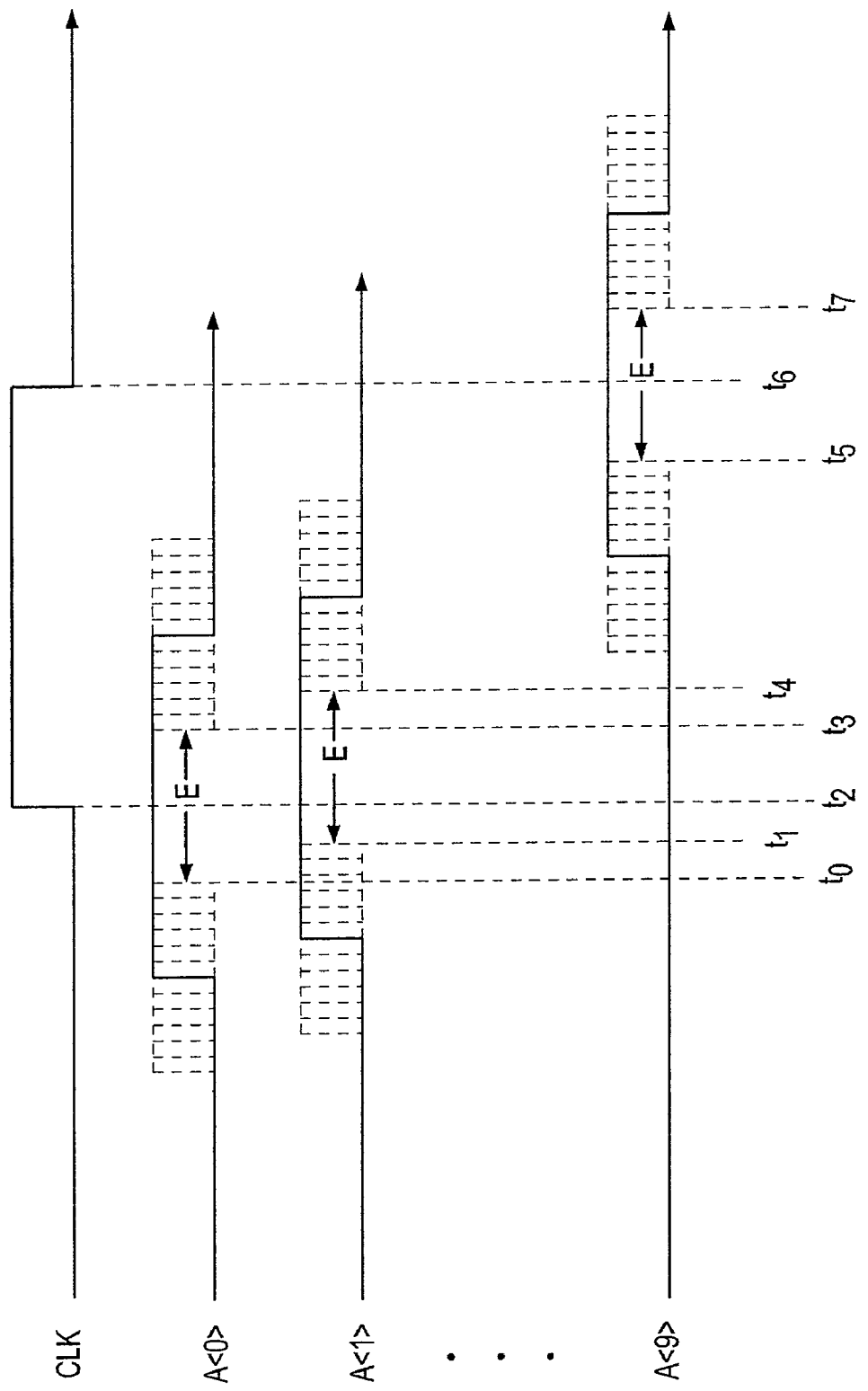
FIG. 2 is a timing diagram showing the manner in which timing skew or jitter can prevent a clock signal from capturing address signals during an "eye" when the address signals are valid.

If the digital signal applied to the signal line is high for more than one clock period, e.g., between times $t_2$ and $t_5$, the signal line is again charged to voltage $V_1$ during the first clock period from times $t_2$ and $t_3$. However, during the next two clock periods between times $t_3$ and $t_5$, the signal line remains at $V_1$ volts because the digital signal applied to the signal line transitions from V* volts to $V_1$ volts after one clock period at time $t_3$. Therefore, the signal line always starts discharging from $V_1$ volts regardless of the number of clock period the digital signal is high. Similarly, when the signal line begins discharging from $V_1$ volts toward 0 Volts at time $t_7$, it again reaches approximately $V_2$ volts after one clock period at time $t_8$. During the next clock period between times $t_8$ and $t_9$, the signal line remains at $V_2$ volts because the digital signal applied to the signal line transitions from 0 volts to $V_2$ volts after one clock period at time $t_8$. Therefore, the signal line always starts charging from $V_2$ volts regardless of the number of clock period the digital signal is low. It can therefore be seen that the voltages between which the signal line is charged and discharged is the same regardless of the pattern of the digital signal applied to the signal line. For this reason, signal jitter of the type exemplified by FIGS. 1 and 2 does not occur.

Figure 4:
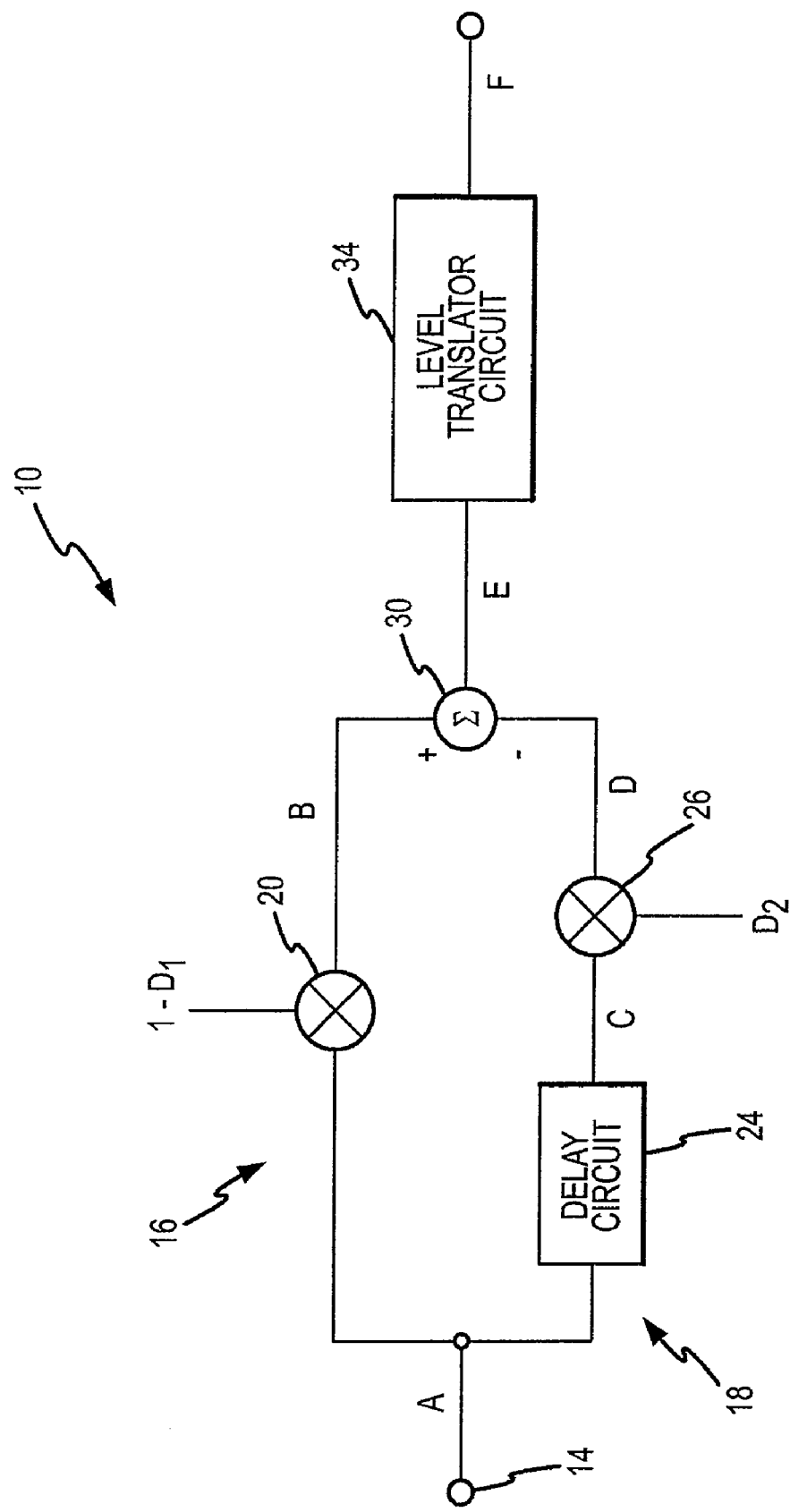
FIG. 4 is a block diagram of a de-emphasis system according to one example of the invention.

A de-emphasis system 10 according to one example of the invention is shown in FIG. 4. The digital signal to be transmitted is applied to an input terminal 14 and is routed through two signal paths 16, 18. The first signal path 16 includes a multiplier 20 that multiples the digital signal by 1-$D_1$, where $D_1$ is the change in the digital signal after the first clock period that the signal remains high. In the example shown in FIG. 3, $D_1$ is equal to V*-$V_1$. For example, if $D_1$=0.25, the multiplier 20 multiplies the digital signal by 0.75. Therefore, if the digital signal transitions between 0 and 1 volts, the signal at the output of the multiplier 20 will transition between 0 and 0.75 volts.

The second signal path 18 includes a delay circuit 24 followed by a second multiplier 26. The delay circuit 24 delays the digital signal applied to the input terminal 14 by one clock period. The multiplier 26 multiples the digital signal by $D_2$, where $D_2$ is the change in the digital signal after the first clock period that the signal remains low. Although $D_2$ need not be equal to $D_1$, it will be assumed for purposes of illustration that such is the case. In the example shown in FIG. 3, $D_2$ is equal to $V_2$. If $D_2$ is also equal to 0.25, the multiplier will multiply the digital signal by 0.25.

The respective outputs of the multipliers 20, 26 are applied to a differential adder 30 that subtracts the output of the second multiplier 26 from the output of the first multiplier 20. The resulting output is applied to a level translator circuit 34. The level translator circuit 34 adds a fixed offset to the signal at the output of the adder 30, which, for purposes of illustration is presumed to be equal to D, where $D=D_1=D_2$. The voltage levels present in the de-emphasis circuit 10 referenced by the letters shown in FIG. 4 for the digital signal shown in FIG. 3 in which $D_1=D_2=0.25$ are as follows

TABLE 1

| Time | A | B | C | D | E | F |
|---|---|---|---|---|---|---|
| t0 | 1 | 0.75 | | | | 0 |
| 0 | 0 | 0 | 1 | 0.25 | −0.25 | 0 |
| | 1 | 0.75 | 0 | 0 | 0.75 | 1 |
| | 1 | 0.75 | 1 | 0.25 | 0.5 | 0.75 |
| | 1 | 0.75 | 1 | 0.25 | 0.5 | 0.75 |
| | 0 | 0 | 1 | 0.25 | −0.25 | 0 |
| | 1 | 0.75 | 0 | 0 | 0.75 | 1 |
| | 0 | 0 | 1 | 0.25 | −0.25 | 0 |
| | 0 | 0 | 0 | 0 | 0 | 0.25 |
| | 1 | 0.75 | 0 | 0 | 0.75 | 1 |

It can be seen that column "F" of Table 1 corresponds to the voltage levels shown in the solid line in FIG. 3.

Figure 5:
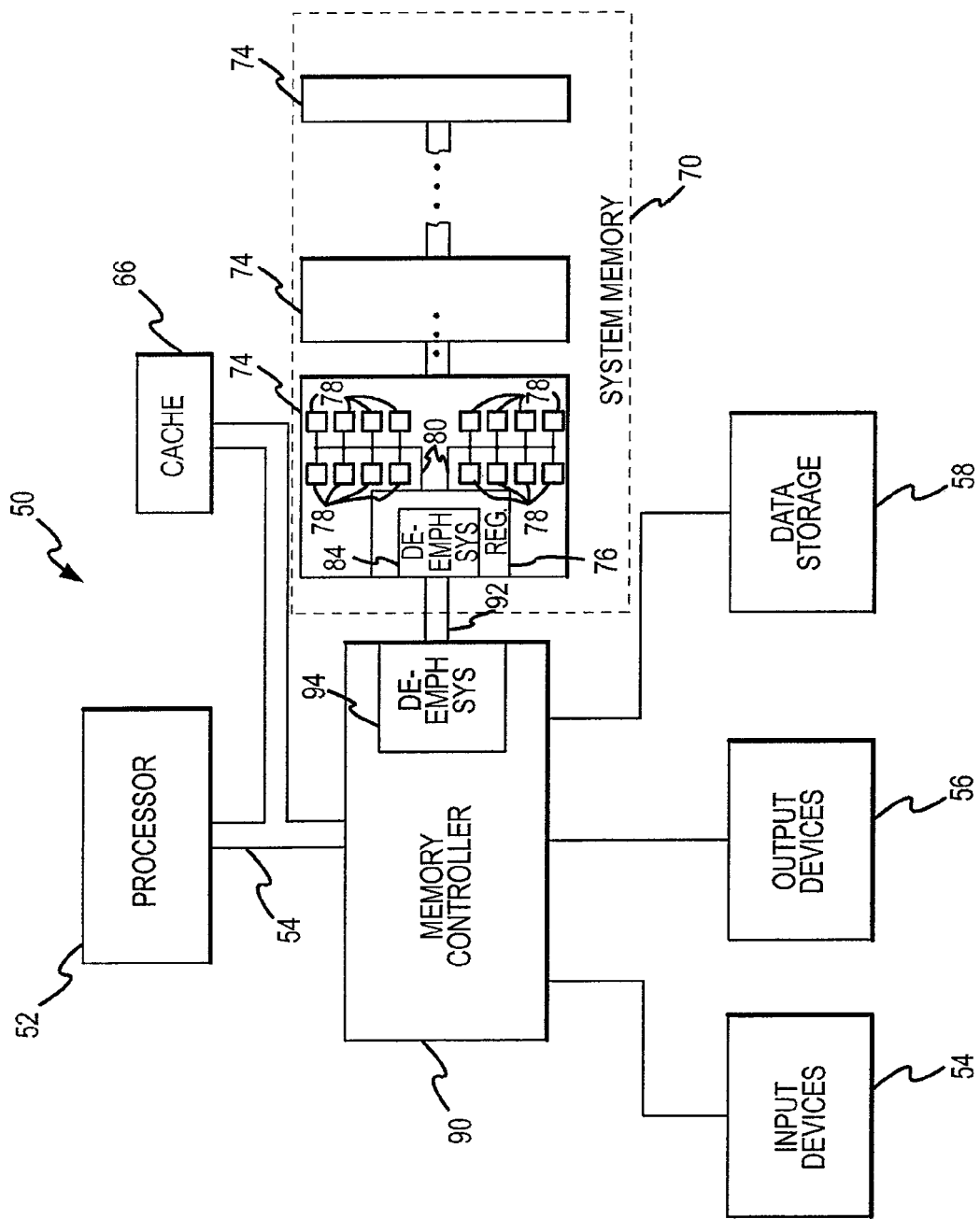
FIG. 5 is a block diagram of a computer system using the de-emphasis system shown in FIG. 4 or a de-emphasis system according to some other example of the invention.

A computer system 50 using the de-emphasis system 10 shown in FIG. 4 is shown in FIG. 5. The computer system 50 includes a processor 52 for performing various computing functions, such as executing specific software to perform specific calculations or tasks. The processor 52 includes a processor bus 54 that normally includes an address bus, a control bus, and a data bus. In addition, the computer system 50 includes one or more input devices 54, such as a keyboard or a mouse, coupled to the processor 52 to allow an operator to interface with the computer system 50. Typically, the computer system 50 also includes one or more output devices 56 coupled to the processor 52, such output devices typically being a printer or a video terminal. One or more data storage devices 58 are also typically coupled to the processor 52 to allow the processor 52 to store data in or retrieve data from internal or external storage media (not shown). Examples of typical storage devices 58 include hard and floppy disks, tape cassettes, and compact disk read-only memories (CD-ROMs). The processor 52 is also typically coupled to cache memory 66, which is usually static random access memory ("SRAM").

The computer system 50 also includes system memory 70, which is in the form of several registered double in-line memory modules ("DIMMs") 74. Each of the DIMMs 74 includes a register 76 coupled to several dynamic random access memory ("DRAM") devices 78 by a system of buses 80 that includes a command bus, an address bus and a data bus. The registers 76 each include a respective de-emphasis system 84 coupled to each of the address bus signals lines, which couple addresses to the DRAM devices 78. The de-emphasis system 84 may also be coupled to each of the command bus lines, which transmit memory commands to the DRAM devices 78. Finally, the de-emphasis system 84 may be coupled to each of the data bus lines, which transmit write data to the DRAM devices 78. Therefore, even though the signal lines of the buses 80 may be highly capacitive, the signals are transmitted from the registers 76 to the DRAM devices 78 with very low signal jitter.

Each of the DIMMs 74 is coupled to a memory controller 90, which is connected to the processor 52 through the processor bus 54. The DIMMs 74 are coupled to the memory controller 90 by a system of buses 92 that again includes a command bus, an address bus and a data bus. The memory controller 90 includes a de-emphasis system 94 coupled to each of the address bus signals lines for transmitted addresses to the DIMMs 74 with relatively low jitter. The de-emphasis system 94 may also be coupled to each of the command bus lines and the data bus lines for transmitting memory commands and write data, respectively, to the DIMMs 74 with relatively low jitter.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

We claim:

1. A method of de-emphasizing a digital signal having first and second logic levels, method comprising:
   in response to the digital signal transitioning from the first logic level to the second logic level, generating the de-emphasized digital signal with a first signal level for a first predetermined period;
   after the first predetermined period, generating the de-emphasized digital signal with a second signal level for as long as the digital signal is at the second logic level;
   in response to the digital signal transitioning from the second logic level to the first logic level, generating the de-emphasized digital signal with a third signal level for a second predetermined period; and
   after the second predetermined period, generating the de-emphasized digital signal with a fourth signal level for as long as the digital signal is at the first logic level.

2. The method of claim 1 wherein the magnitude of the first signal level is substantially equal to the magnitude of the second logic level.

3. The method of claim 1 wherein the magnitude of the third signal level is substantially equal to the magnitude of the first logic level.

4. The method of claim 1 wherein the duration of the first predetermined period is equal to the duration of the second predetermined period.

5. The method of claim 4 wherein the digital signal is synchronized to a clock signal, and wherein the first and second predetermined delays are substantially equal to one period of the clock signal.

6. The method of claim 1 wherein the magnitude of the third signal level is substantially equal to the magnitude of the first logic level, and wherein the magnitude of the first signal level is substantially equal to the magnitude of the second logic level.

7. The method of claim 1 wherein the magnitudes of the second and fourth signal levels are intermediate the magnitudes of the first and third signal levels.

8. A method of transmitting an output signal corresponding to a digital signal having either a first logic level or a second logic level, the method comprising:

in response to the digital signal transitioning from the first logic level to the second logic level, transmitting the output signal with a first signal level for a first predetermined period;

after the first predetermined period, transmitting the output signal with a second signal level for as long as the digital signal is at the second logic level;

in response to the digital signal transitioning from the second logic level to the first logic level, transmitting the output signal with a third signal level for a second predetermined period; and after the second predetermined period, transmitting the output signal with a fourth signal level for as long as the digital signal is at the first logic level.

9. The method of claim 8 wherein the magnitude of the first signal level is substantially equal to the magnitude of the second logic level, and the magnitude of the third signal level is substantially equal to the magnitude of the first logic level.

10. The method of claim 1 wherein the duration of the first predetermined period is equal to the duration of the second predetermined period.

11. The method of claim 10 wherein the digital signal is synchronized to a clock signal, and wherein the first and second predetermined delays are substantially equal to one period of the clock signal.

12. The method of claim 10 wherein the magnitudes of the second and fourth signal levels are intermediate the magnitudes of the first and third signal levels.

13. A method of de-emphasizing a digital signal having first and second logic levels, method comprising:

in response to the digital signal transitioning from the first logic level to the second logic level, generating a de-emphasized signal that initially overshoots a second signal level and then remains at the second signal level while the digital signal is at the second logic level; and in response to the digital signal transitioning from the second logic level to the first logic level, generating the de-emphasized signal so that it initially overshoots a first signal level and then remains at the first signal level while the digital signal is at the first logic level.

14. The method of claim 13 wherein the magnitude of the second signal level is substantially equal to the magnitude of the first logic level.

15. The method of claim 13 wherein the magnitude of the first signal level is substantially equal to the magnitude of the second logic level.

16. The method of claim 13 wherein the de-emphasized signal overshoots the second signal level for a predetermined period.

17. The method of claim 13 wherein the de-emphasized signal overshoots the second signal level for a period that is substantially equal to a period that the de-emphasized signal overshoots the first signal level.

18. A method of generating a de-emphasized signal corresponding to a digital signal, comprising:

in response to the digital signal transitioning from a first logic level to a second logic level, initially changing the magnitude of the de-emphasized signal to a first signal level and then changing the magnitude of the de-emphasized signal to a second signal level until the digital signal transitions from the second logic level; and in response to the digital signal transitioning from the second logic level to the first logic level, initially changing the magnitude of the de-emphasized signal to a third signal level and then changing the magnitude of the de-emphasized signal to a fourth signal level until the digital signal transitions from the first logic level.

19. The method of claim 18 wherein the magnitude of the first signal level is substantially equal to the magnitude of the second logic level.

20. The method of claim 18 wherein the magnitude of the third signal level is substantially equal to the magnitude of the first logic level.

21. The method of claim 18 wherein the magnitudes of the second and fourth signal levels are intermediate the magnitudes of the first and third signal levels.

22. The method of claim 18 wherein the de-emphasized signal is at the first signal level for a predetermined period of time.

23. The method of claim 18 wherein the de-emphasized signal is at the first signal level for a period of time that is substantially equal to a period of time that the de-emphasized signal is at the third signal level.

* * * * *

UNITED STATES PATENT AND TRADEMARK OFFICE
CERTIFICATE OF CORRECTION

PATENT NO.         : 7,514,979 B2                                     Page 1 of 1
APPLICATION NO.    : 12/113066
DATED              : April 7, 2009
INVENTOR(S)        : Greeff et al.

It is certified that error appears in the above-identified patent and that said Letters Patent is hereby corrected as shown below:

In column 1, line 9, delete "2006." and insert -- 2006, now Pat. No. 7,375,573. --, therefor.

Signed and Sealed this

Thirtieth Day of June, 2009

JOHN DOLL
*Acting Director of the United States Patent and Trademark Office*